United States Patent
Mun

[19]

[11] Patent Number: 6,159,332
[45] Date of Patent: Dec. 12, 2000

[54] SYSTEM FOR ETCHING POLYSILICON IN FABRICATING SEMICONDUCTOR DEVICE

[75] Inventor: Seong Yeol Mun, Chungcheongbuk-do, Rep. of Korea

[73] Assignee: Hyundai Electronics Industries Co., Ltd., Kyoungki-do, Rep. of Korea

[21] Appl. No.: 08/928,635

[22] Filed: Sep. 12, 1997

[30] Foreign Application Priority Data

Sep. 12, 1996 [KR] Rep. of Korea ............... 96-39495

[51] Int. Cl.[7] .................... C23F 1/02; C23C 16/00
[52] U.S. Cl. ........................... 156/345; 118/715
[58] Field of Search ................. 156/345; 118/715

[56] References Cited

U.S. PATENT DOCUMENTS

| | | | |
|---|---|---|---|
| 5,758,680 | 6/1998 | Kavel et al. | 137/14 |
| 5,759,214 | 6/1998 | Ohmi et al. | 29/25.01 |
| 5,777,300 | 7/1998 | Homma et al | 219/679 |
| 5,874,012 | 2/1999 | Kanai et al. | 216/67 |
| 5,904,567 | 5/1999 | Yamazaki | 438/689 |

*Primary Examiner*—Keith Hendricks
*Assistant Examiner*—Drew Becker

[57] ABSTRACT

A system for etching polysilicon in fabricating a semiconductor device is disclosed, which can prevent contamination of a wafer with polymers formed during a polysilicon etching process in which the polysilicon coated on the wafer is selectively etched. The system includes a reaction chamber having a wafer chuck placed therein on which a wafer is loaded for proceeding an etching process, a passage for discharging a reaction gas from the reaction chamber, a vacuum pump disposed below one side of the passage for pumping out the gas inside of the reaction chamber, a pressure control valve disposed at an inlet to the vacuum pump for controlling a flow rate of the gas being pumped, and a valve driving motor for driving the pressure control valve.

11 Claims, 2 Drawing Sheets

SYSTEM FOR ETCHING POLYSILICON IN FABRICATING SEMICONDUCTOR DEVICE

BACKGROUND OF THE INVENTION

1. Field of the Invention

The present invention relates to a system for etching polysilicon in fabricating a semiconductor device and, more particularly, to a system for etching polysilicon in fabricating a semiconductor device which can prevent contamination of a wafer with polymers formed during a polysilicon etching process in which the polysilicon coated on the wafer is selectively etched.

2. Discussion of the Related Art

In a polysilicon etching process, polymers are reaction products formed by the reaction of plasma and polysilicon when a photoresist film is coated on a polysilicon film formed on a wafer and exposed.

Referring to FIG. 1, a conventional device for etching polysilicon in a semiconductor fabricating process includes a reaction chamber 3 having a wafer chuck 2 placed therein onto which a wafer 1 is loaded for etching. A passage 11 is connected to the reaction chamber 3 for discharging a reaction gas from the chamber. A vacuum pump 7 is disposed on one side of the passage 11 for evacuating the reaction chamber 3. A pressure control valve 4 disposed at an inlet to the vacuum pump 7 controls the flow rate of the gas being pumped, and a valve driving motor 6 drives the pressure control valve 4.

In the conventional device for etching polysilicon using the aforementioned system, the process includes maintaining a pressure in the reaction chamber 3 at a predetermined pressure of 5~7 Torr by driving the vacuum pump 7 while injecting a reaction gas into the reaction chamber 3 after a wafer 1 is loaded on the wafer chuck 2, which is an anode.

However, use of the conventional device as shown in FIG. 1 for etching polysilicon results in accumulation of polymers, which are reaction products of plasma and polysilicon, on the surface of the pressure control valve 4 and inside of the vacuum pump 7. Particularly, a significant amount of polymers forms on the reaction chamber side surface of the pressure control valve 4 due to its mounting position. After finishing the etching process, the vacuum pump 7 continuously pumps for a predetermined time period for discharging the polymers from the reaction chamber 3 to outside of the device. Since no reaction gas is injected into the chamber during that time period the pressure inside of the reaction chamber 3 drops sharply to 0 mm Torr. Consequently, the conventional device for etching polymers has an inherent problem in that the polymers act as foreign matter in the etching process. Polymers re-enter the reaction chamber 3 from vibration of the pressure valve 4 caused by the sharp drop of pressure within the chamber. Further, the vibration loosens the polymers deposited on the inlet of the vacuum pump 7 and pressure control valve 4 which causes the floating polymers to re-enter the reaction chamber 3.

Because the bottom opening of the vacuum pump 7, is located above the opening to the reaction chamber 3, the conventional device for etching polysilicon allows a significant amount of polymers deposited inside of the vacuum pump to migrate through the opened inlet of the vacuum pump 7. When the vacuum pump 7 is suddenly stopped, the polymers deposited on the pressure control valve 4 (and in the pump 7) drop down during opening/closing of the pressure control valve 4 which seriously contaminates the reaction chamber 3.

SUMMARY OF THE INVENTION

Accordingly, the present invention is directed to a system for etching polysilicon as part of fabricating a semiconductor device that substantially obviates one or more of the problems due to the limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the system for etching polysilicon for fabrication of a semiconductor device includes a reaction chamber having a wafer chuck placed therein on which a wafer is loaded for proceeding an etching process, a passage for discharging a reaction gas from the reaction chamber, a vacuum pump disposed below one side of the passage for pumping out the gas inside of the reaction chamber, a pressure control valve disposed at an inlet to the vacuum pump for controlling a flow rate of the gas being pumped, a valve driving motor for driving the pressure control valve, and a cleaning gas injecting line connected to one side of the reaction chamber for injecting a cleaning gas.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
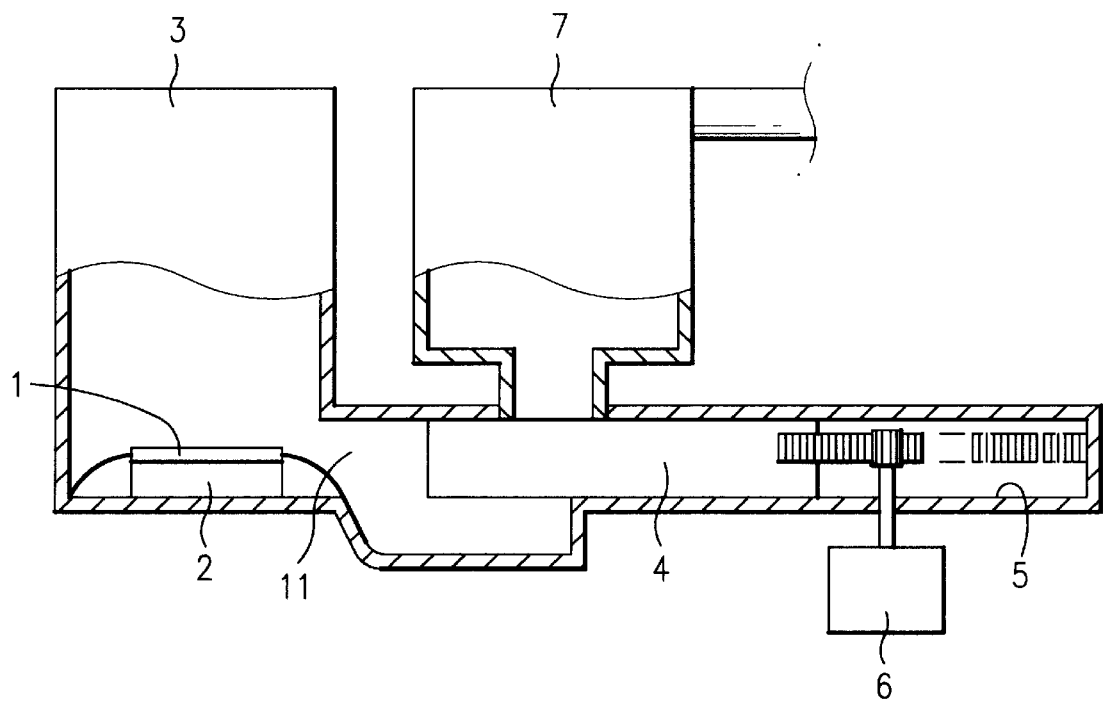
FIG. 1 illustrates a system of a conventional device for etching polysilicon for fabricating a semiconductor device; and, FIG. 2 illustrates a system of a device for etching polysilicon for fabricating a semiconductor device in accordance with a preferred embodiment of the present invention.
Figure 2:
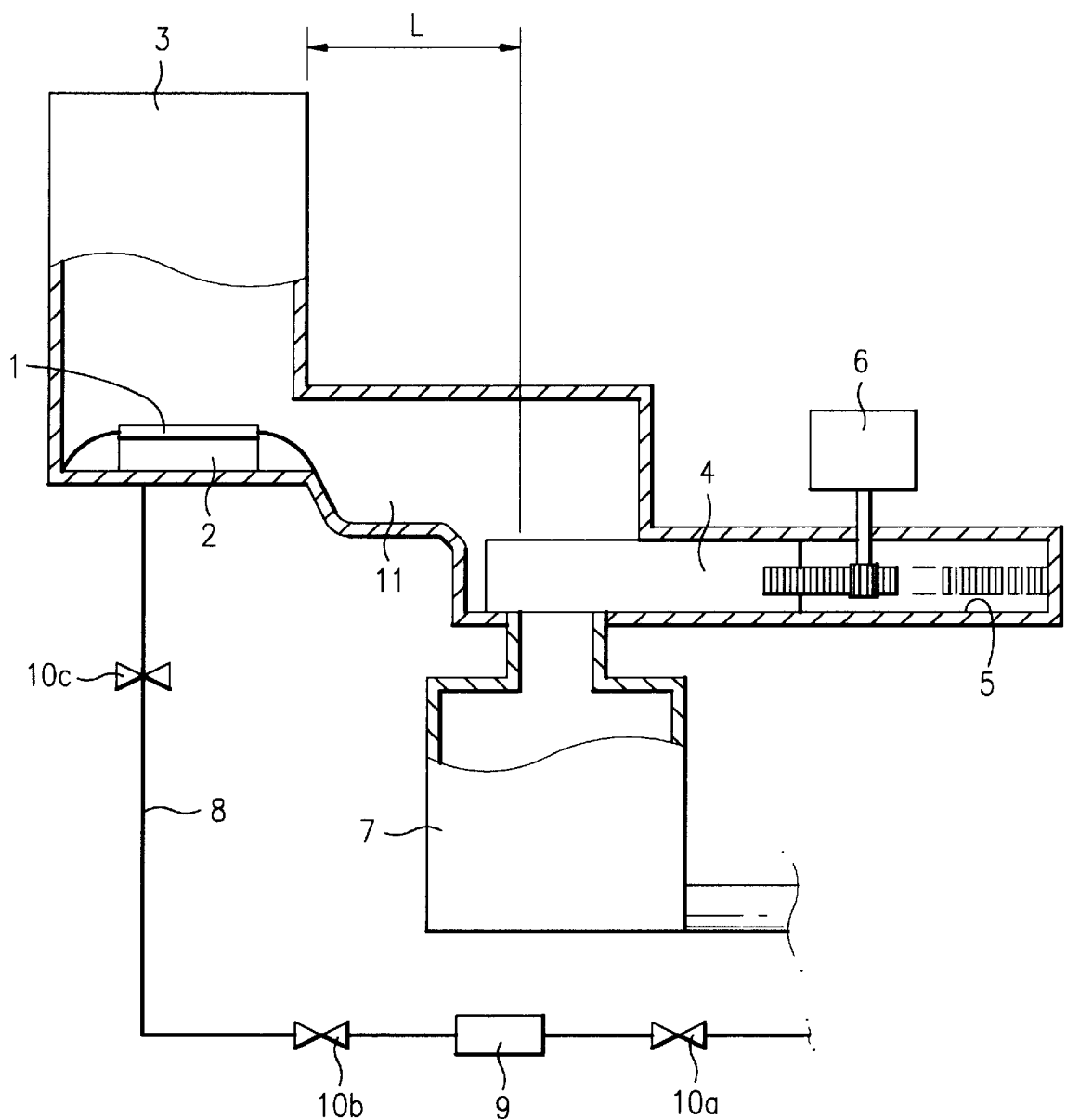

FIG. 2 illustrates a system for etching polysilicon in fabricating a semiconductor device in accordance with a preferred embodiment of the present invention.

Referring to FIG. 2, the system for etching polysilicon in fabricating a semiconductor device includes a reaction chamber 3 having a wafer chuck 2 placed therein on which a wafer 1 is loaded for etching. Passage 11 extends from the reaction chamber 3 for discharging a reaction gas from the reaction chamber 3. A vacuum pump 7 is disposed below the lower side of the passage 11 for pumping gas from inside of the reaction chamber 3. The inlet to the vacuum pump 7 is below a reference plane defined by the outlet of the reaction chamber 3 or a plane defined by the lower edge of the passage 11. A pressure control valve 4 is disposed at an inlet to the vacuum pump 7 for controlling a flow rate of the gas being pumped. A valve driving motor 6 drives the pressure control valve 4. A cleaning gas injecting line 8 is connected to one side of the reaction chamber 3 for injecting a cleaning gas therein.

The passage 11 is designed to have two stepped portions and to extend between the pump 7 and the reaction chamber 3. The length (L) of the passage 11 measured from the outlet of the reaction chamber 3 to the leading edge of the inlet for pump 7 is preferably 30~70 cm where the capacity of the vacuum pump is 1000~2000 cc/sec. Notwithstanding the preferred embodiment, the length of the passage 11 may vary with the capacity of the vacuum pump. If the capacity of the vacuum pump 7 is 1000~2000 cc/sec, the length should not be shorter than 30 cm (or there is the possibility of the polymers re-entering from a sharp pressure drop). Similarly, the length of the passage should not be greater than 70 cm, (otherwise the suction power of the vacuum pump is to too weak).

In order to prevent accumulation of polymers due to formation of polymer vortexes at the edges of the passage 11 from the reaction chamber outlet to the vacuum pump inlet, the edges of the steps are substantially rounded.

The pressure in the reaction chamber 3 is continuously maintained at a given level by opening and closing the pressure control valve 4. A manometer 12 is provided for monitoring the pressure within the reaction chamber 3. The manometer 12 is connected to the valve driving motor 6 which opens and closes the valve 4 to maintain the desired pressure.

A mass flow controller (MFC) 9 is located in the cleaning gas injecting line 8. A plurality of flow control valves 10a, 10b and 10c are provided on both sides of the MFC 9 in the cleaning gas injecting line 8. Helium is used as the cleaning gas to be injected into the reaction chamber 3. The flow rate of the cleaning gas into the reaction chamber 3 is determined to be a rate that can maintain a consistent pressure in the reaction chamber 3 that is substantially the same pressure as during the fabricating process.

Operation of the system for etching polysilicon in fabricating a semiconductor device will be explained.

A process for etching polysilicon in fabricating a semiconductor device using the above-described system first includes injecting a process gas into the reaction chamber 3. At the same time, the vacuum pump 7 is driven to reduce the pressure in the reaction chamber 3 to a predetermined level(5~7 mm Torr). Thereafter, the fabrication process proceeds. After finishing the polysilicon etching process, the vacuum pump 7 is driven for discharging reaction products formed in the reaction chamber 3 and, at the same time, helium gas is injected into the reaction chamber 3 through the cleaning gas injection line 8 connected to one side of the reaction chamber 3. The cleaning gas is injected at a flow rate which can maintain the fabrication pressure at substantially the same pressure in the reaction chamber 3 as during fabrication. Maintaining the pressure in the reaction chamber 3 at substantially the same pressure as during the fabrication process minimizes vibration of the pressure control valve 4 that normally occurs during a pressure drop. The lack of pressure drop also reduces the number of floating polymers deposited on the pressure control valve 4 and at the inlet to the vacuum pump 7 that are typically shaken away.

Because of the individual and cumulative effects of (1) the vacuum pump 7 being disposed below the passage 11, (2) the pressure control valve 4 being disposed at the inlet to the vacuum pump 7, and (3) the passage having two steps, the possibility of floating polymers originally deposited on the pressure control valve 4 is significantly reduced.

Injecting the helium gas into the reaction chamber 3 and discharging it through the vacuum pump 7 (together with the polymers) during pumping, prevents a pressure drop inside of the reaction chamber 3. Injection of the helium gas yields a cleaning effect inside of the reaction chamber 3 by discharging much of the resident polymers. In addition, the rounded edges in the two steps in the passage 11 prevents accumulation of the polymers at the edges caused by the polymer vortexes.

An additional advantage is that only a small pressure difference exists between the pressure inside a load lock (not shown) (in which wafers are stored temporarily for processing) and the pressure inside of the reaction chamber 3. By maintaining the pressure in the reaction chamber at substantially the same pressure even during fabrication, opening of a door (not shown) on the reaction chamber 3 for loading a wafer 1 into the reaction chamber 3 does not promote the entering of foreign matters into the reaction chamber 3 from the load lock.

The system for etching polysilicon in fabricating a semiconductor device of the present invention has the following advantages.

Maintaining substantially the same pressure in the reaction chamber 3 before and after an etching process minimizes vibration of the pressure control valve 4, and consequently minimizes floating of the polymers into the reaction chamber. Since the pressure in the reaction chamber does not drop substantially, entrance of foreign matters from the load lock, which is disposed around the reaction chamber 3 for temporary storage of wafers for processing, into the reaction chamber can be minimized.

The injection of helium gas after the fabrication process and pumping out of the helium gas allows an effective cleaning of the reaction chamber interior as compared to the polymer discharge without the helium gas. A passage having the two step configuration, together with the change of passage length, and the location of the vacuum pump 7 below one side of the passage facilitates pumping and, thus minimizes the possibility of entrance of the polymers into the reaction chamber occurred when the vacuum pump is stopped.

Accordingly, by reducing wafer contamination from the polymers formed during polysilicon etching in which polysilicon coated on top of the wafer 1 is selectively etched, the system for etching polysilicon for fabrication of a semiconductor device of the present invention can improve yield of the semiconductor devices.

It will be apparent to those skilled in the art that various modifications and variations can be made in the device for etching polysilicon for fabrication of a semiconductor device of the present invention without departing from the spirit or scope of the invention. Thus, it is intended that the present invention cover the modifications and variations of this invention provided they come within the scope of the appended claims and their equivalents.

What is claimed is:

1. An apparatus for etching polysilicon during fabrication of a semiconductor device comprising:

a reaction chamber in which a wafer is loaded for etching;

a passage for discharging a reaction gas from the reaction chamber;

a vacuum pump disposed along the passage for pumping the reaction gas from inside the reaction chamber;

a pressure control valve disposed between the passage and an inlet to the vacuum pump for controlling a flow rate of the reaction gas being pumped in maintaining a predetermined pressure of the reaction gas within the reaction chamber;

a valve driving motor for driving the pressure control valve; and a clean gas injecting arrangement to inject a clean gas into the reaction chamber and to maintain a clean gas pressure substantially equal to the predetermined pressure within the reaction chamber by displacing the reaction gas in the reaction chamber with said clean gas to reduce the presence of impurities and polymers inside the reaction chamber;

wherein the passage has two stepped portions exclusive of an opening to said pressure control valve.

2. The apparatus as claimed in claim 1, wherein the two stepped portions of the passage have rounded edges.

3. The apparatus of claim 1, wherein a length of the passage is substantially between 30 to 70 cm relative to a vacuum pump capacity between 1000 to 2000 cc/sec.

4. An apparatus as claimed in claim 1, wherein said clean gas injecting arrangement includes a clean gas injecting line, connected to the reaction chamber, for communicating a clean gas into the reaction chamber from an exterior source.

5. An apparatus as claimed in claim 1, wherein the clean gas injected through the clean gas injecting line is helium.

6. An apparatus as claimed in claim 1, wherein the clean gas injecting arrangement comprises a mass flow controller, provided in the clean gas injecting line, and a plurality of flow control valves, provided on both sides of the mass flow controller, for controlling the flow of clean gas into the reaction chamber.

7. An apparatus as recited in claim 1, further comprising:

a wafer chuck, located within the interior of the reaction chamber, for supporting the wafer during etching.

8. An apparatus as recited in claim 3, wherein the passage length is measured between an outlet of the reaction chamber and the leading edge of an inlet to the vacuum pump.

9. An apparatus as recited in claim 1, wherein an outlet of the reaction chamber defines a reference plane; and an inlet of the vacuum pump is located below the reference plane.

10. An apparatus as recited in claim 1, wherein the length of the passageway is equal to or greater than 30 cm.

11. An apparatus as recited in claim 1, wherein the length of the passageway is equal to or less than 70 cm.

* * * * *